(12) United States Patent
Abukawa et al.

(10) Patent No.: US 11,631,574 B2
(45) Date of Patent: Apr. 18, 2023

(54) HEATER COMPONENT

(71) Applicant: TOCALO CO., LTD., Kobe (JP)

(72) Inventors: Shikou Abukawa, Akashi (JP); Kensuke Taguchi, Akashi (JP); Yu Asakimori, Akashi (JP); Ryutaro Kawamura, Akashi (JP)

(73) Assignee: TOCALO CO., LTD., Kobe (JP)

( * ) Notice: Subject to any disclaimer, the term of this patent is extended or adjusted under 35 U.S.C. 154(b) by 326 days.

(21) Appl. No.: 16/764,042

(22) PCT Filed: Oct. 29, 2018

(86) PCT No.: PCT/JP2018/040059
§ 371 (c)(1),
(2) Date: May 14, 2020

(87) PCT Pub. No.: WO2019/102794
PCT Pub. Date: May 31, 2019

(65) Prior Publication Data
US 2020/0286718 A1 Sep. 10, 2020

(30) Foreign Application Priority Data

Nov. 24, 2017 (JP) .............................. JP2017-226296

(51) Int. Cl.
*H01J 37/32* (2006.01)
*H01L 21/683* (2006.01)
(Continued)

(52) U.S. Cl.
CPC .... *H01J 37/32724* (2013.01); *H01L 21/6833* (2013.01); *H01L 21/68757* (2013.01);
(Continued)

(58) Field of Classification Search
CPC .............. H05B 1/0233; H01L 21/6831; H01L 21/68757; H01L 21/6833
See application file for complete search history.

(56) References Cited

U.S. PATENT DOCUMENTS 5,528,451 A 6/1996 Su
5,539,179 A 7/1996 Nozawa et al.
(Continued)

FOREIGN PATENT DOCUMENTS

CN 102741998 A 10/2012
EP 1753014 2/2007
(Continued)

*Primary Examiner* — Thien S Tran
(74) *Attorney, Agent, or Firm* — Knobbe, Martens, Olson & Bear LLP

(57) ABSTRACT

The heater component (1) has a substrate part (2), and a thin coating heater (4) which is equipped outside this substrate part (2) and generates heat by power supply. The thin coating heater (4) is formed of a thermal sprayed coating. The thin coating heater (4) has a heater body (10) and a heater extension part (11). The heater body (10) is arranged on a first end face (2a) of the substrate part (2). The heater extension part (11) is extended from the heater body (10) to a second end face (2b) of the substrate part (2) through a side surface (2c) of the substrate part (2). A tip part (11s) of the heater extension part (11) is a heater power supplying part (12) for supplying electric power to the heater body (10).

8 Claims, 14 Drawing Sheets

(51) Int. Cl.
*H01L 21/687* (2006.01)
*H05B 1/02* (2006.01)
*H05B 3/03* (2006.01)
*H05B 3/28* (2006.01)

(52) U.S. Cl.
CPC ............ *H05B 1/0233* (2013.01); *H05B 3/03* (2013.01); *H05B 3/283* (2013.01); *H01J 2237/3341* (2013.01); *H05B 2203/013* (2013.01)

(56) References Cited

U.S. PATENT DOCUMENTS

| | | | |
|---|---|---|---|
| 2007/0045271 A1* | 3/2007 | Kimura | H05B 3/143 219/216 |
| 2008/0080118 A1 | 4/2008 | Shiraiwa et al. | |
| 2009/0178764 A1 | 7/2009 | Kanno et al. | |
| 2012/0299253 A1 | 11/2012 | Kosakai et al. | |
| 2015/0116889 A1 | 4/2015 | Yamasaki et al. | |
| 2015/0373783 A1 | 12/2015 | Kitagawa | |
| 2017/0133258 A1 | 5/2017 | Miwa et al. | |

FOREIGN PATENT DOCUMENTS

| | | |
|---|---|---|
| JP | H04-186653 A | 7/1992 |
| JP | H08-241920 A | 9/1996 |
| JP | 2007-073363 A | 3/2007 |
| JP | 2007-317772 A | 12/2007 |
| JP | 2008-085245 A | 4/2008 |
| JP | 2009-170509 A | 7/2009 |
| JP | 2015-088745 A | 5/2015 |
| JP | 2016-027601 A | 2/2016 |
| KR | 20150013497 A | 2/2015 |
| TW | 201604990 | 2/2016 |
| WO | WO 2015/153756 A1 | 10/2015 |
| WO | 2019102794 | 5/2019 |

* cited by examiner

[FIG. 1]
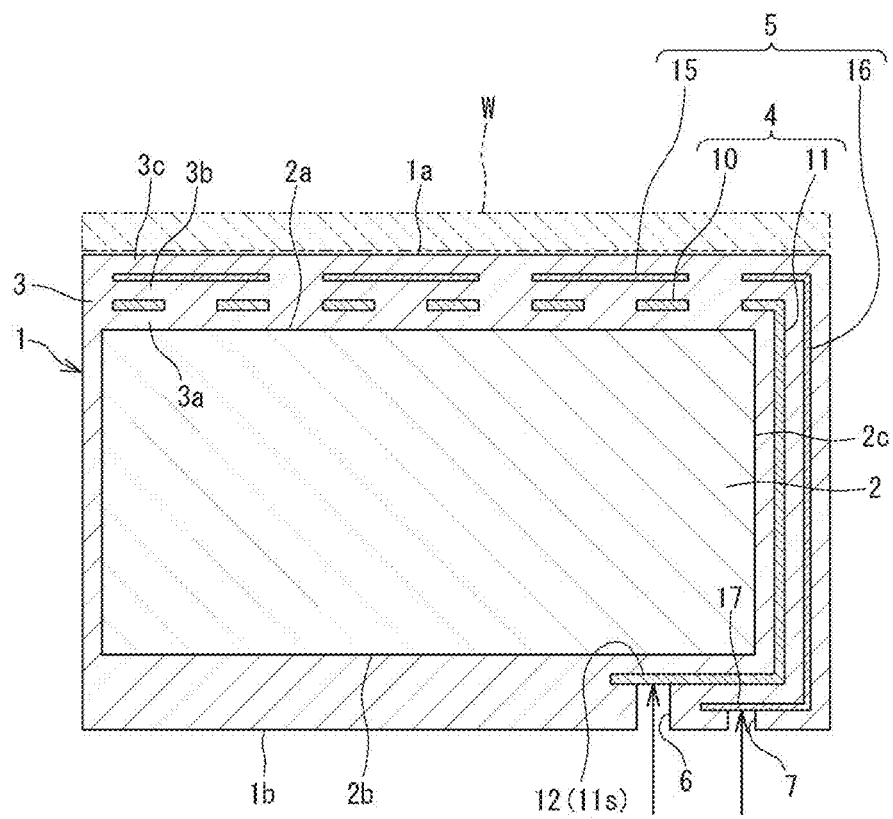

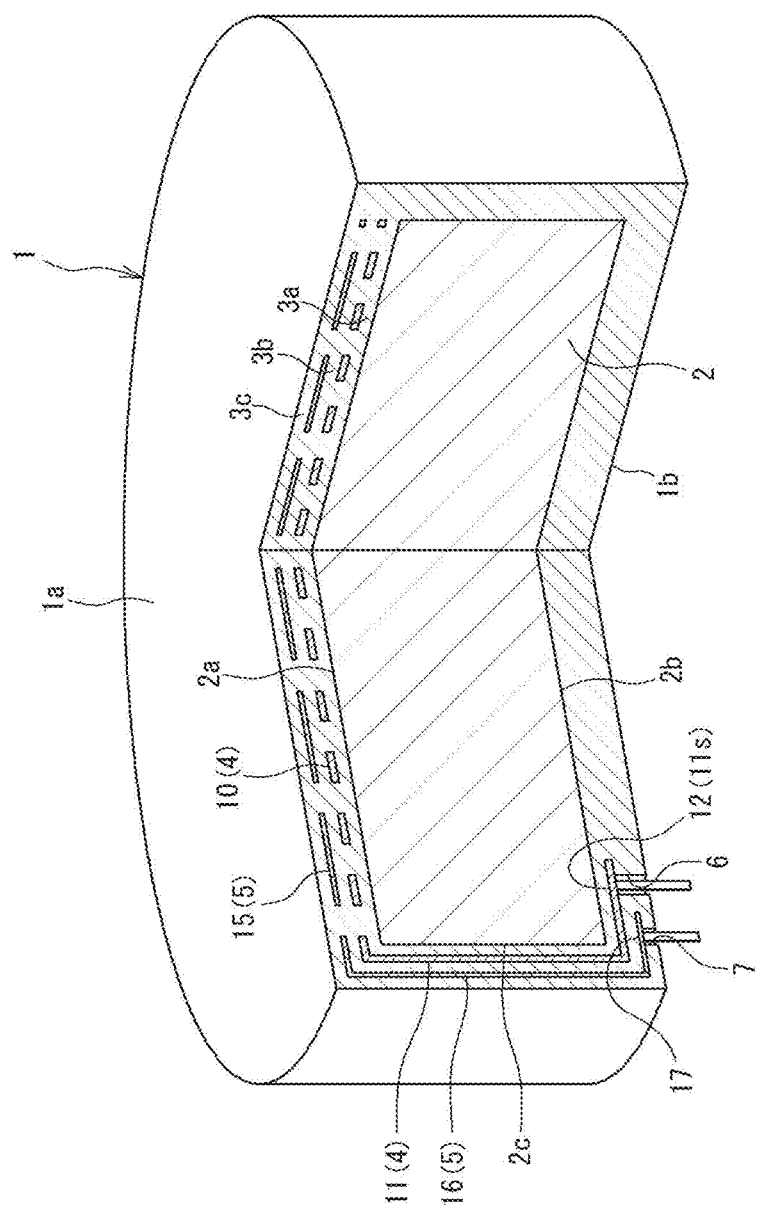
[FIG. 2]

[FIG. 3]
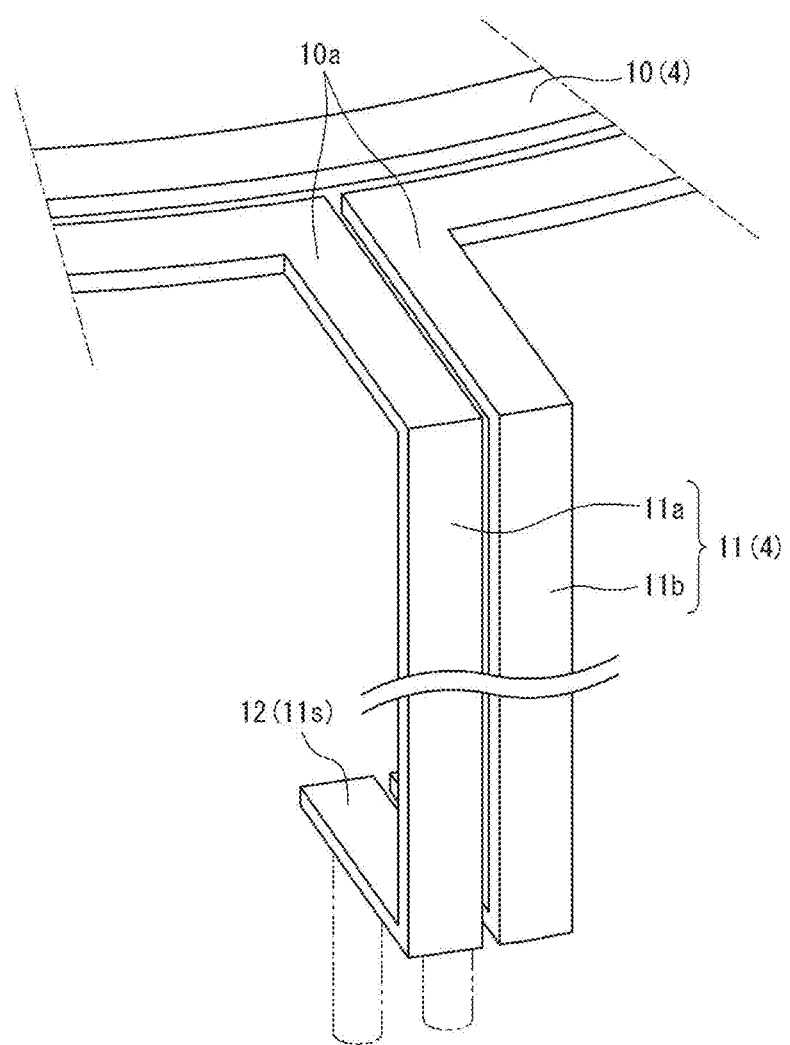

[FIG. 4]
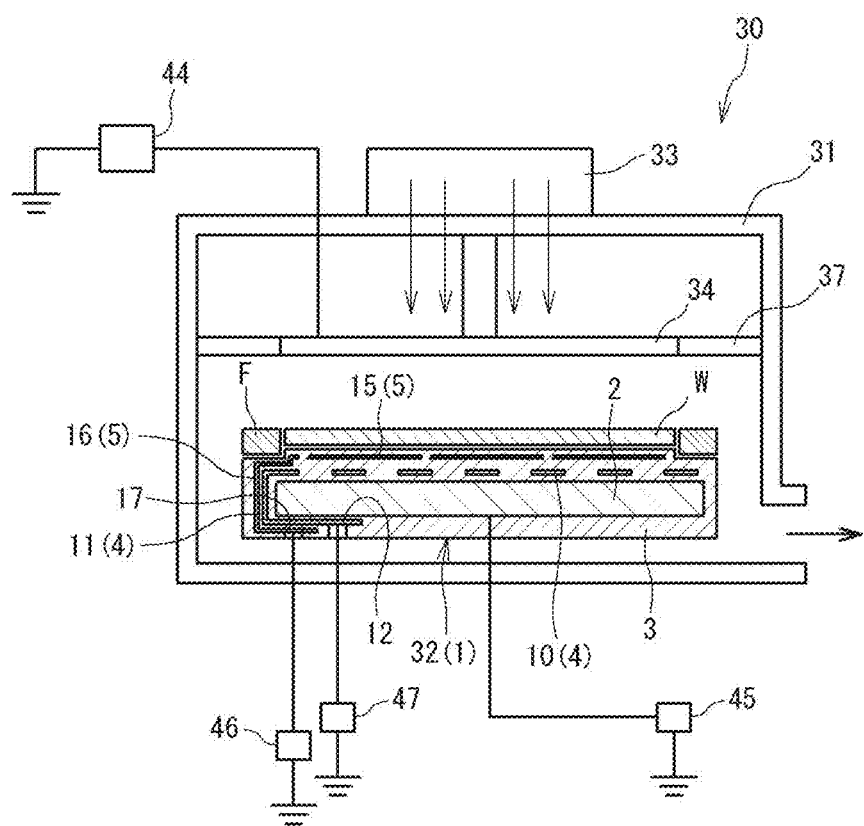

[FIG. 5]
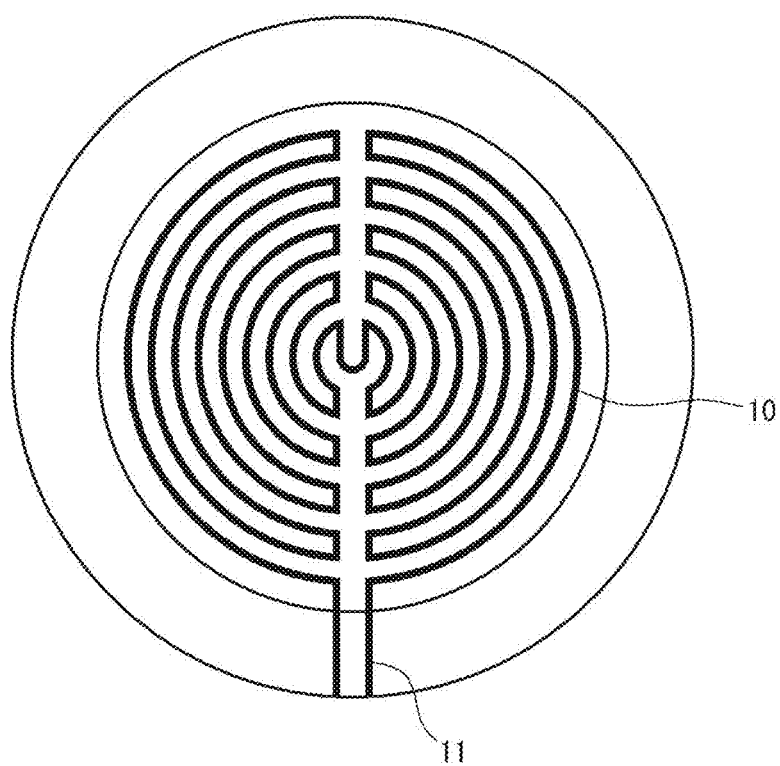

[FIG. 6]
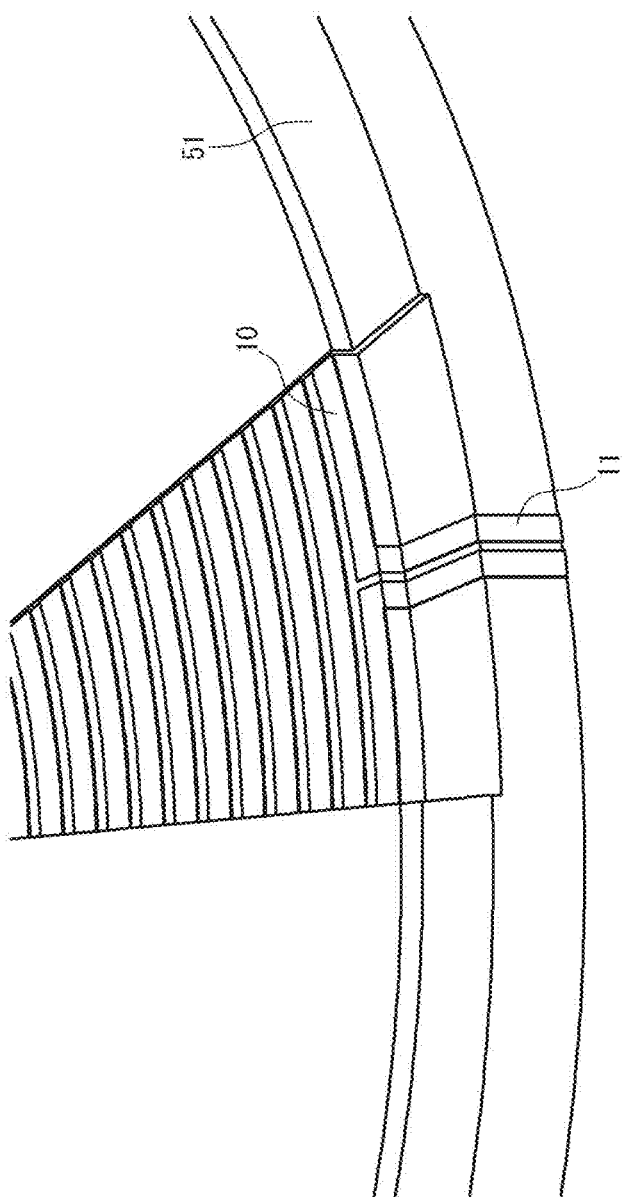

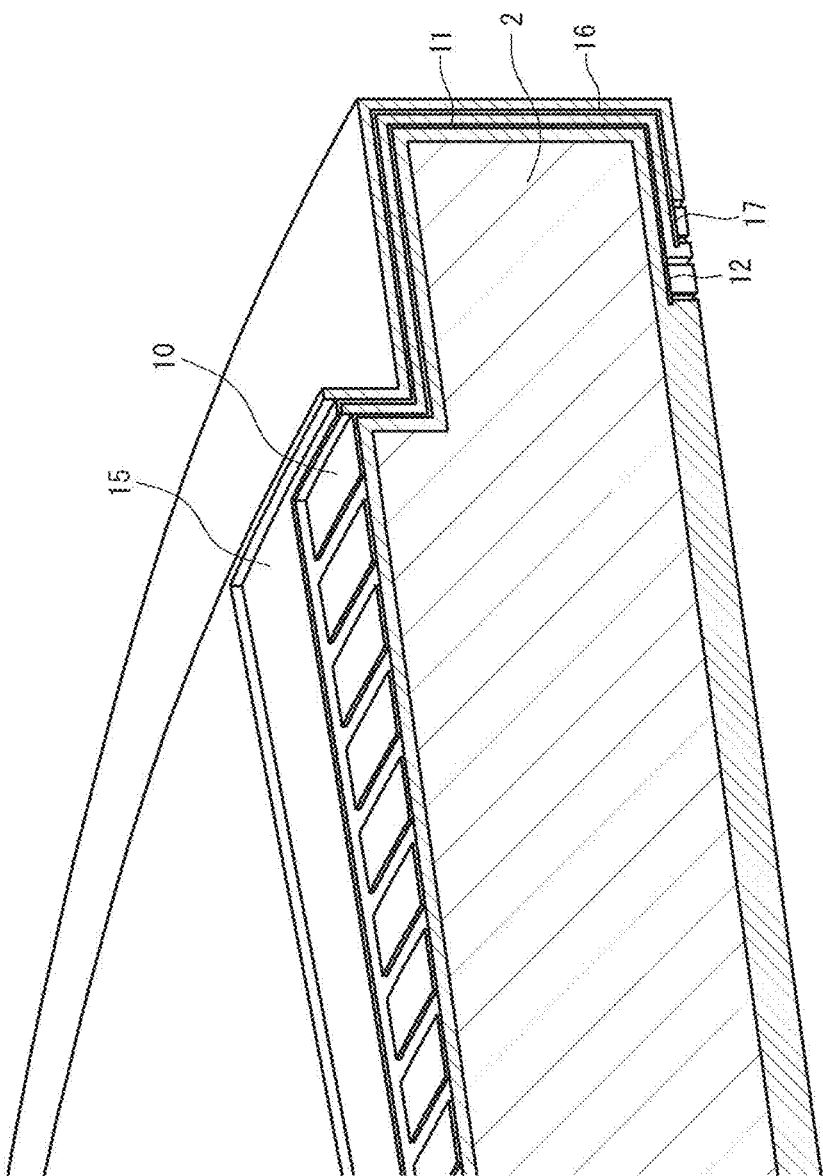
[FIG. 7]

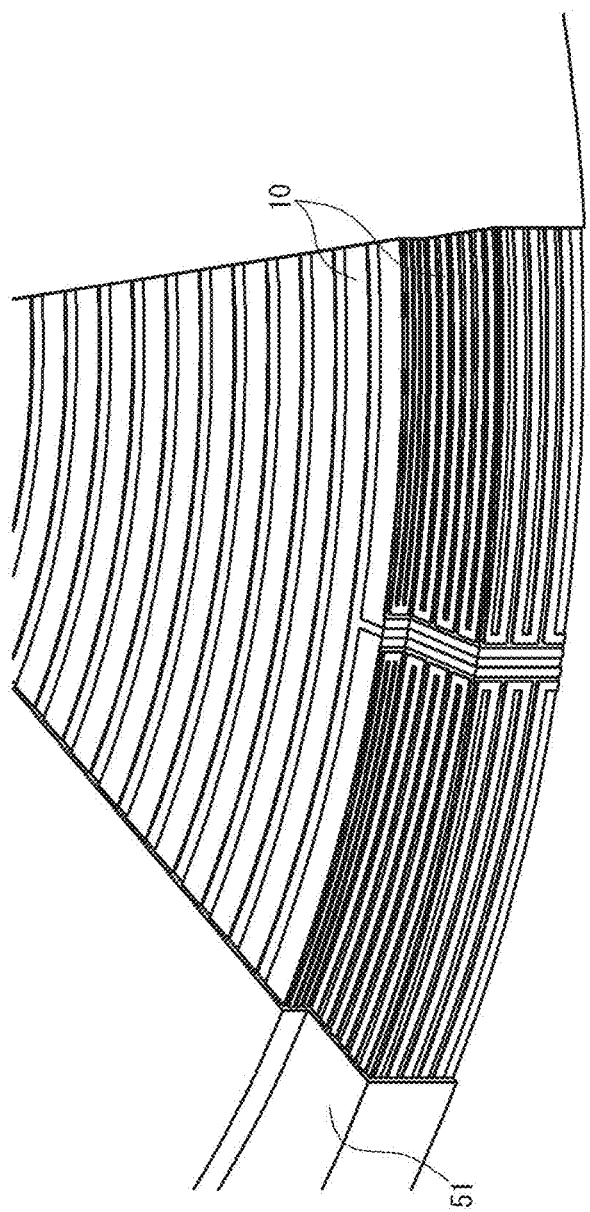
[FIG. 8]

[FIG. 9]
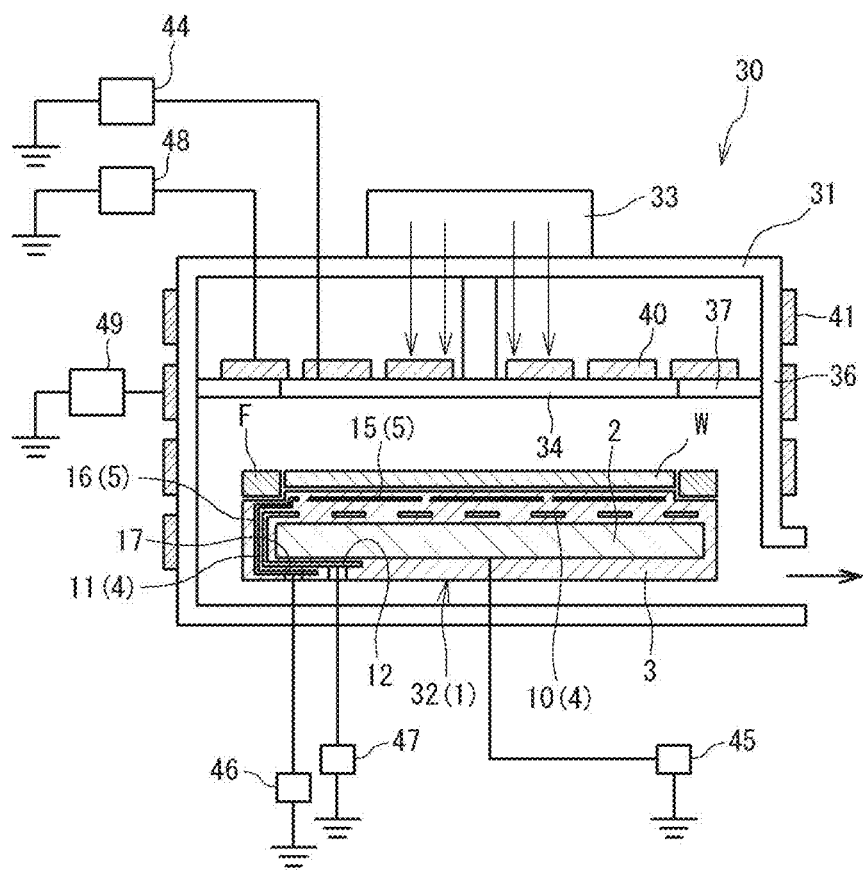

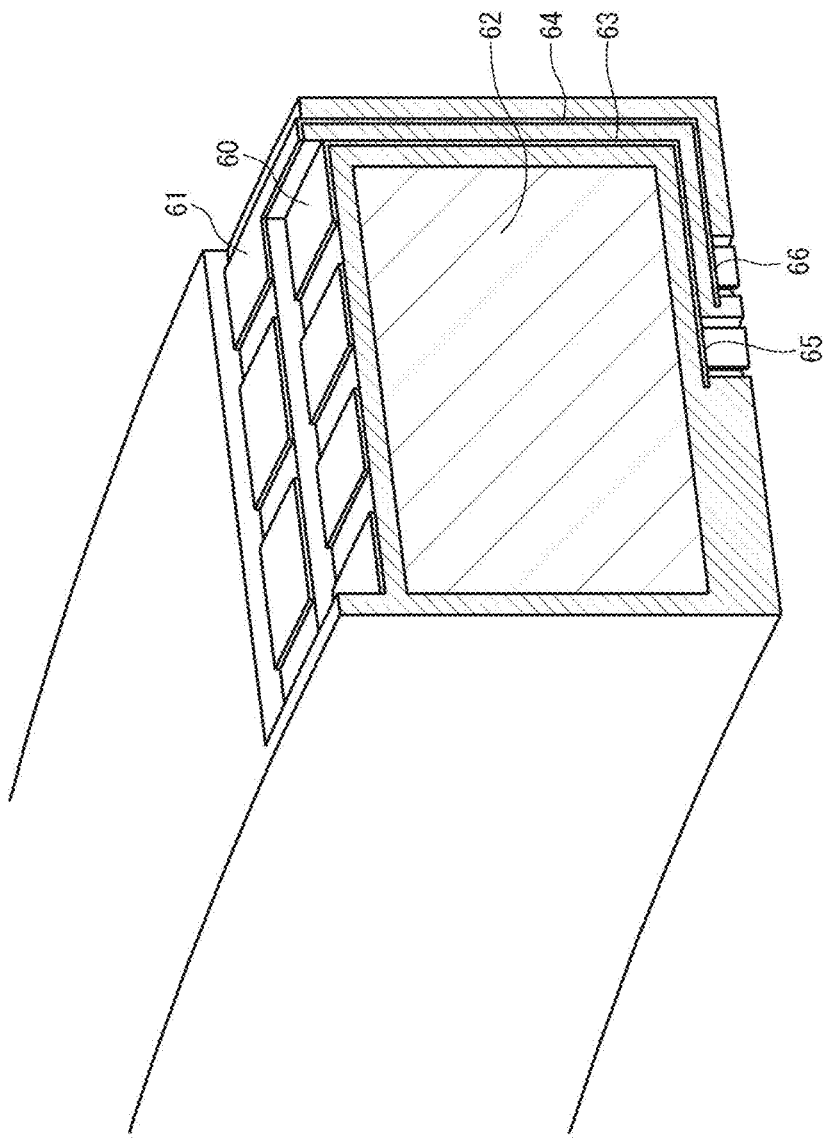
[FIG. 11]

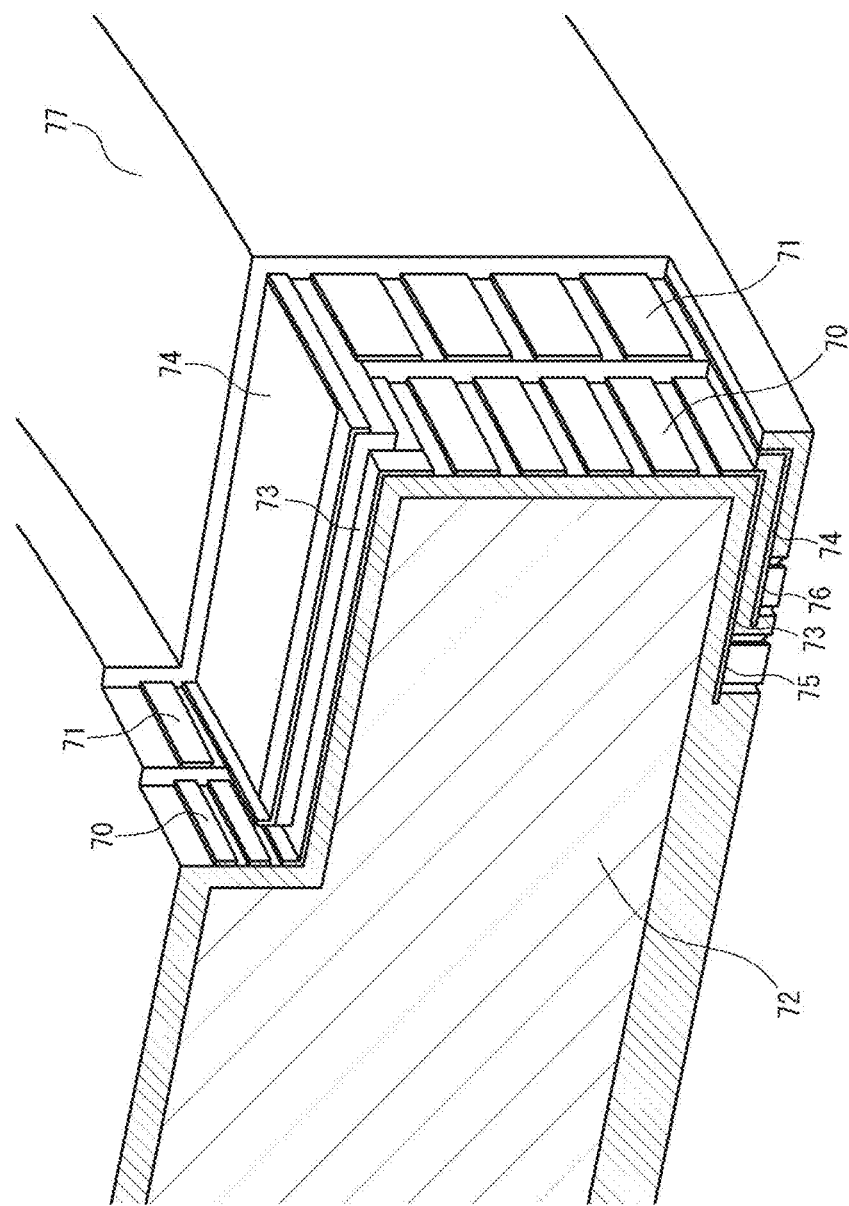
[FIG. 12]

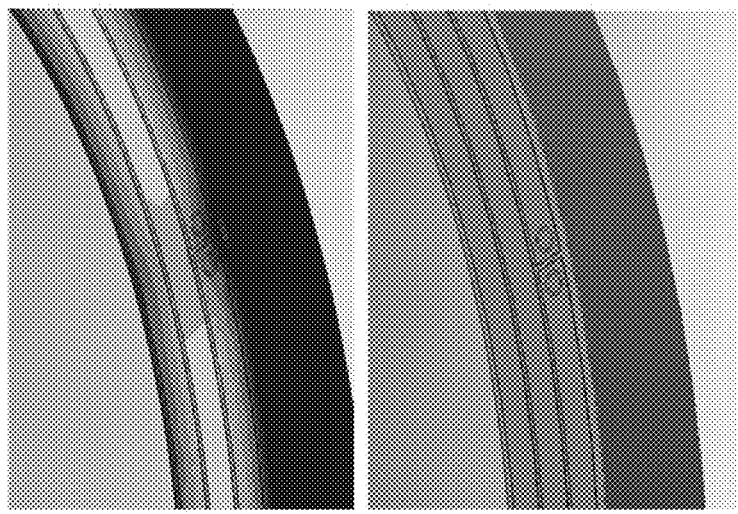
FIG. 13B
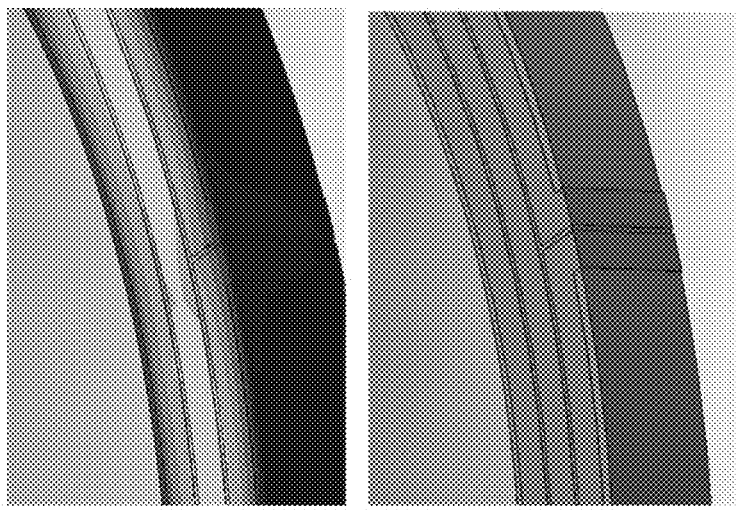
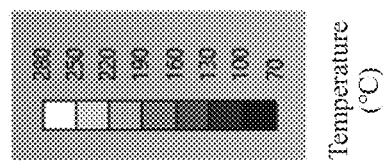
FIG. 13A

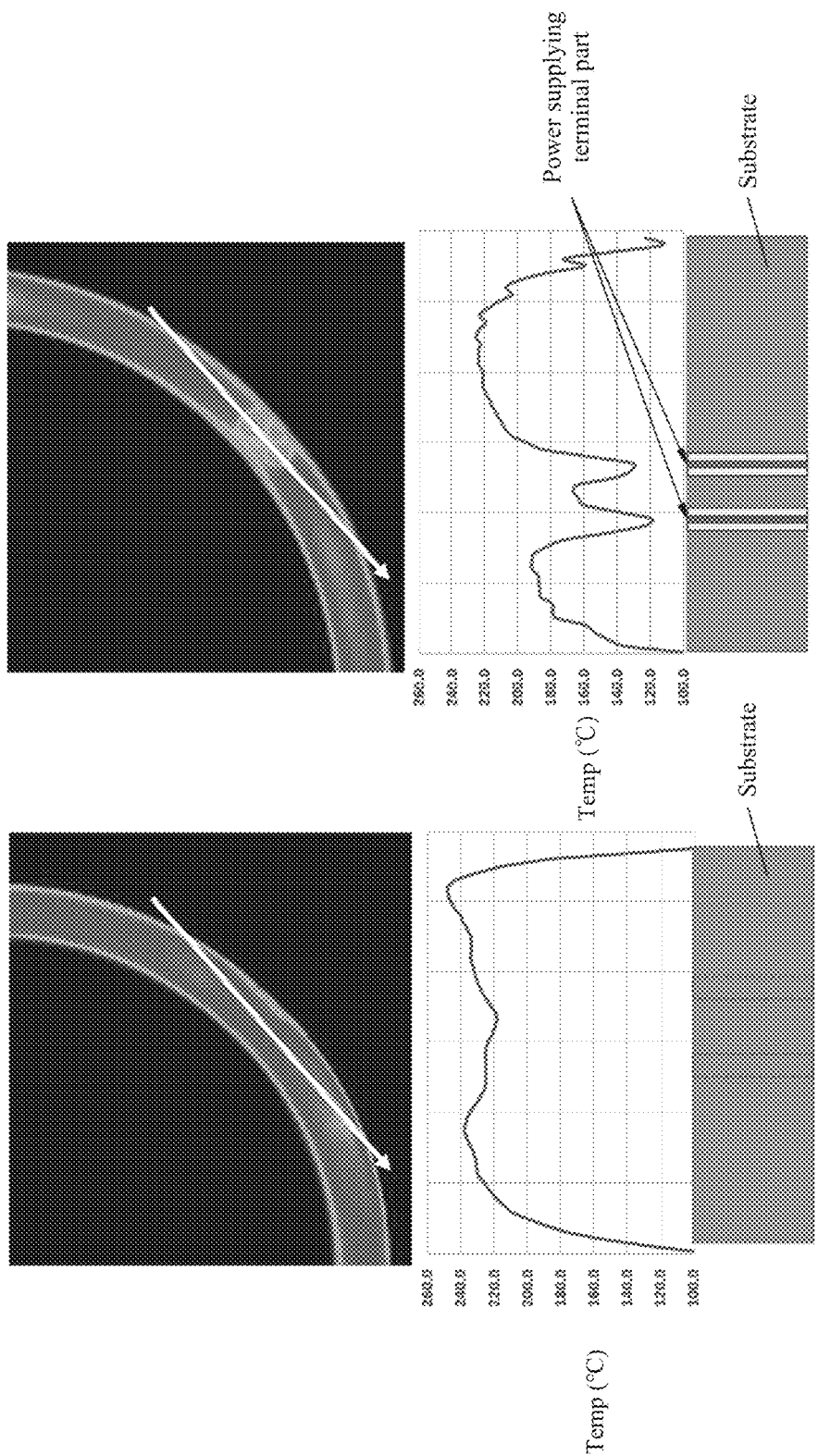

HEATER COMPONENT

RELATED APPLICATIONS

The present application is the national phase of International Application No. PCT/JP2018/040059, filed on Oct. 29, 2018, which claims priority to and the benefit of Japanese Patent Application No. 2017-226296, filed on Nov. 24, 2017, and the disclosures of which are hereby incorporated herein by reference in their entireties.

TECHNICAL FIELD

The present invention relates to heater components. The heater component is applied to, for example, an electrostatic chuck, an upper electrode, a chamber wall and a top plate of a semiconductor manufacturing apparatus.

BACKGROUND ART

In recent years, a dry method which is carried out under vacuum or reduced pressure, such as dry etching or the like, is often adopted for microfabrication of a wafer in a semiconductor manufacturing process. In the dry etching using plasma, there is heat input from the plasma to the wafer. Since wafer temperature affects the etching rate, if there is unevenness in temperature distribution of the wafer, etching depth varies. Accordingly, a heater unit is arranged below the wafer and in-plane temperature of the wafer is kept uniform, as described in Patent Literatures 1 to 3.

Patent Literature 1 describes a plasma processing apparatus having an electrostatic chuck which includes a conductive substrate, an insulating material formed on the substrate and a strip-shaped heater formed of a thermal sprayed coating formed inside the insulating material. At the end of the heater equipped in the electrostatic chuck, a connection part of a power supplying terminal penetrating the substrate and the insulating material is equipped.

Patent Literature 2 describes an electrostatic chuck apparatus in which onto a metal base part are joined a support plate and a mounting plate made of alumina sintered bodies sandwiching an internal electrode for electrostatic attraction therebetween. A power supplying terminal is fitted into a through hole in the thickness direction formed in the base part. A conductive wire equipped for the power supplying terminal is connected to a power supplying member equipped penetrating through the support plate, and this power supplying member is electrically connected to a lower surface of the internal electrode for electrostatic attraction.

Patent Literature 3 describes a plasma processing apparatus in which is arranged a mounting table having a base stand and an electrostatic chuck on the base stand. To a heater equipped in the electrostatic chuck, a heater power source is connected from below. A focus ring equipped outside the electrostatic chuck is on the base stand via a support part, and a heater electrode formed by thermal spraying for controlling a temperature of the focus ring is equipped inside the support part. A power supplying mechanism for the heater electrode is constituted so as to penetrate below the heater electrode of the support part and the base stand.

CITATION LIST

Patent Literature

[Patent Literature 1] Japanese Laid-Open Patent Publication No. 2009-170509

[Patent Literature 2] Japanese Laid-Open Patent Publication No. 2015-088745

[Patent Literature 3] Japanese Laid-Open Patent Publication No. 2016-027601

SUMMARY OF INVENTION

Technical Problem

In the apparatuses described in Patent Literatures 1 and 3, a power supplying mechanism is constituted below the heater built in the electrostatic chuck or the like having a function as a heater component for controlling a temperature of the water or the focus ring. Also in the apparatus described in Patent Literature 2, a power supplying mechanism is constituted below the internal electrode. That is, in each of these apparatuses, the through hole is equipped in the substrate which forms the lower side of the heater or the internal electrode, and a power supplying pin is inserted into the through hole and electrically connected to a lower surface of the heater or the electrode.

However, there is a problem that when a through hole is equipped in a substrate and a power supplying member is connected from a lower surface of a heater, a temperature in the vicinity of a contact point between the heater and the power supplying member becomes to be different from a temperature in other heater areas, so that the temperature in the vicinity of the contact point becomes to be a singular point and temperature uniformity in the heater area is impaired. FIG. 13B is a schematic view showing the result of simulation of temperature distribution in the vicinity of a heater power supplying position according to a conventional power supplying pin structure. Positions represented by two adjacent small circles shown in FIG. 13B are parts where power supplying pins are in contact from below, and it can be seen that a temperature in the vicinity of contact points is lower than a temperature in other heater areas.

When a through hole is equipped inside a substrate as in the apparatuses described in Patent Literatures 1 to 3, there is a problem that stress concentration occurs around the through hole. In addition, there is a problem that due to difference in thermal expansion between the substrate, the heater and the power supplying member during heat generation, a position in the vicinity of the power supplying position is damaged and strength is reduced.

In view of the problems of the conventional technologies, the present invention has an object of providing a heater component which is able to improve temperature uniformity in a heater area and capable of maintaining durability.

Solution to Problem

The heater component of the present invention has a substrate part and a thin coating heater which is equipped outside the substrate part and generates heat by power supply. The thin coating heater is formed of a thermal sprayed coating, and has a heater body and a heater extension part extended from the heater body. The heater extension part is extended onto a surface of the substrate part, and the surface is different from a surface of the substrate part on which the heater body is arranged. A tip part of the heater extension part constitutes a heater power supplying part for supplying electric power to the heater body.

According to the present invention, the thin coating heater has the heater body and the heater extension part extended from the heater body. Both of the heater body and the heater extension part are formed of the thermal sprayed coating.

The heater extension part is extended onto the surface which is different from the surface on which the heater body is arranged. The tip part of the heater extension pail constitutes the heater power supplying part for supplying electric power to the heater body. In case of thermal spraying, a pattern coating can be formed continuously and uniformly on different surfaces, unlike other coating forming methods such as a PVD method and a CVD method. That is, in the present invention, both of the heater body and the heater extension part are equipped outside the substrate part, and furthermore, the heater body and the heater power supplying part are equipped on different surfaces of the substrate part, respectively. According to this configuration, a singular point of temperature does not occur in the heater body, temperature uniformity in the heater area can be improved, and furthermore, decrease in strength during heat generation can be prevented.

FIG. 13(a) is a schematic view showing the result of simulation of temperature distribution in the vicinity of a heater power supplying position, which is one embodiment of a power supplying structure according to the present invention. FIGS. 14(a) and 14(b) are graphs showing temperature distribution obtained by preparing samples corresponding to FIGS. 13(a) and 13(b) and actually measuring by using of an infrared thermography. As shown in these figures, it can be seen that since the heater extension part is extended onto the surface which is different from the surface on which the heater body is arranged, there is no singular point in the temperature distribution in the vicinity of the power supplying position and temperature in the heater area becomes to be uniform.

A position of the heater power supplying part is not particularly limited as long as the heater power supplying part is constituted outside the substrate part and on the surface which is different from the surface on which the heater body is arranged. For example, in case the substrate part has a three-dimensional shape having a first end face and a second end face facing the first end face, when the heater body is arranged on the first end face, the heater power supplying part may be constituted on a side surface ranging between the first end face and the second end face, or may be constituted on the second end face opposed to the first end face.

From the viewpoint of improving temperature uniformity in the heater area, the thin coating heater which is formed of the thermal sprayed coating is preferably formed in a strip shape, and the heater body preferably has a repeated pattern. In case the heater body has the repeated pattern, a heated surface having pseudo uniformity of temperature distribution can be formed, in this case, the heater extension part preferably has a single linear pattern. The repeated pattern includes (i) a pattern in which a plurality of strips are arranged in parallel, (ii) a zigzag pattern in which one strip has a folded part as a boundary, and a front section and a rear section with the boundary in the strip are parallel to each other, and (iii) a pattern in which one strip is brandied into a plurality of strips, and the branched parts are parallel to each other. From the viewpoint of controlling a wider surface with high definition, the heater body preferably has three or more repeated patterns parallel to each other.

The thin coating heater is preferably composed of a metal element selected from Mo, W, Ta, Cr, Ti, Al, Si, Ni, Nb, Fe, Cu, Ag and Pt, an alloy containing one or more of these metal elements, a conductive compound containing one or more of these metal elements, or a mixture thereof.

The heater power supplying part preferably has any of a connection structure to which a tip of a power supplying cable is joined, a connection structure to which a tip of a power supplying cable is connected via a power supplying socket, and a connection structure to which a tip of a power supplying cable is directly pressed and attached.

The heater component of the present invention may further include an electrode part outside the substrate part. The electrode part preferably has an electrode body and an electrode extension part extended from the electrode body. It is preferred that the electrode extension part is extended onto a surface of the substrate part, and the surface is different from a surface of the substrate part on which the electrode body is arranged, and a tip part of the electrode extension part constitutes an electrode power supplying part for supplying electric power to the electrode body. When the substrate part has a three-dimensional shape having a first end face and a second end face facing the first end face, and in case the electrode body is arranged on the first end face, the electrode power supplying part may be constituted on a side surface ranging between the first end face and the second end face, or may be constituted on the second end face.

The electrode part is preferably formed of a thermal sprayed coating. In case of thermal spraying, a pattern coating can be formed continuously and uniformly on different surfaces, unlike other coating forming methods such as a PVD method and a CVD method. When the electrode body and the electrode extension part are equipped outside the substrate part, and furthermore, the electrode body and the electrode power supplying part are equipped on different surfaces of the substrate part, it is possible to supply electric power to the electrode part without equipment of through holes in the substrate part. According to this configuration, occurrence of temperature unevenness in the heater area and decrease in strength due to equipment of the through holes can be prevented.

Advantageous Effects of Invention

According to the present invention, the tip part of a part extended from the heater body constitutes the heater power supplying part, electric power is supplied to the heater body via the part extended from the heater body, and it is not necessary to equip the through holes for power supply in the substrate part. As a result, temperature uniformity in the heater area can be improved. Accordingly, durability of the heater component can be maintained.

BRIEF DESCRIPTION OF DRAWINGS

FIG. 1 is a cross-sectional view showing an example in which a heater component according to one embodiment of the present invention is applied to an electrostatic chuck.

FIG. 2 is a perspective view showing a part of the heater component cut out from FIG. 1.

FIG. 3 is an enlarged perspective view showing a connecting portion between a heater body and a heater extension part of a thin coating heater in the heater component shown in FIG. 1.

FIG. 4 is a cross-sectional view showing one example of a plasma processing apparatus in which a heater component according to one embodiment of the present invention is applied to an electrostatic chuck.

FIG. 5 is a plan view showing an example of a pattern of a thin coating heater.

FIG. 6 is a perspective view showing a modified example of an electrostatic chuck.

FIG. 7 is a perspective view showing a modified example of an electrostatic chuck.

FIG. 8 is a perspective view showing another example of the thin coating heater in the electrostatic chuck shown in FIGS. 6 and 7.

FIG. 9 is a cross-sectional view showing one example of a plasma processing apparatus in which a heater component according to one embodiment of the present invention is applied to each of an upper electrode and a chamber wall.

FIG. 10A shows a cross section on the inner peripheral surface side of the substrate part, and FIG. 10B shows a cross section on the outer peripheral surface side of the substrate part.

FIG. 11 is a perspective view showing one embodiment when a substrate part has a tubular shape (annular shape).

FIG. 12 is a perspective view showing one embodiment when a substrate part has a three-dimensional shape including a step part.

FIGS. 13A and 13B are schematic views each showing the result of simulation of temperature distribution in the vicinity of a heater power supplying position. FIG. 13A shows one embodiment of a power supplying structure according to the present invention, and FIG. 13B shows a conventional power supplying pin structure.

FIGS. 14A and 14B are graphs each showing temperature distribution obtained by preparing samples corresponding to FIGS. 13A and 13B and actually measuring by using of an infrared thermography.

DESCRIPTION OF EMBODIMENTS

Figure 10A:
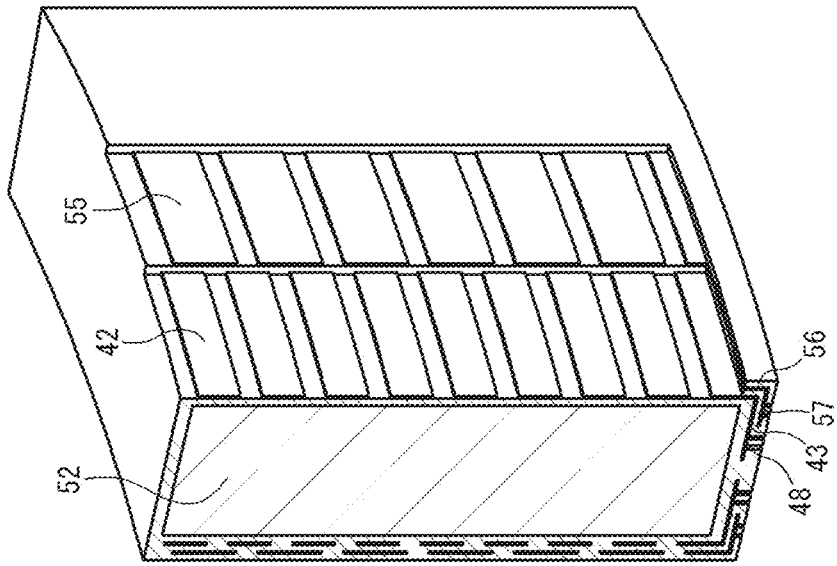
FIGS. 10A and 10B are perspective views each showing one embodiment when a substrate part has a tubular shape (annular shape).

An embodiment of the heater component of the present invention will be described. FIG. 1 is a cross-sectional view showing an example in which a heater component 1 according to one embodiment of the present invention is applied to an electrostatic chuck. FIG. 2 is a perspective view showing a part of the heater component 1 cut out from FIG. 1. The heater component 1 is constituted as the electrostatic chuck, and a mounted wafer W is attracted to a mounting surface and a temperature is controlled.

The heater component 1 has a substrate part 2, an insulating layer 3 formed so as to cover the substrate part 2, a thin coating heater 4 which is equipped outside the substrate part 2 and generates heat by power supply, and an electrode part 5 which is equipped outside the substrate part 2. A surface of the heater component 1 on which the wafer W is mounted is a mounting surface 1a, and a surface opposite to the mounting surface 1a is a bottom surface 1b of the heater component 1.

The substrate part 2 has a solid cylindrical shape having prescribed height and diameter, and has a first end face 2a (mounting surface 1a side) and a second end face 2b (bottom surface 1b side) facing each other. The two end faces 2a and 2b of the substrate part 2 are both planar, and are formed such that their surfaces are parallel to each other.

The substrate part 2 is composed of a single material such as a metal bulk body, and serves as a strength-intended basic structure of the heater component 1. The substrate part 2 may have a columnar shape other than a solid cylindrical shape, a plate shape, a bowl shape, a tubular shape (annular shape), a tapered shape or the like, or may have a three-dimensional shape including a step. The insulating layer, the thin coating heater and the electrode part are equipped in a manner corresponding to the shape of the substrate part 2. When the substrate part has a hollow tubular shape, the insulating layer, the thin coating heater and the electrode part can be equipped, for example, on the inner peripheral side and the outer peripheral side of the substrate part.

Examples of a constituent material of the substrate part 2 include conductive materials such as an aluminum alloy, a titanium alloy, a copper alloy, and stainless steel. An insulator such as a ceramic sintered body or another conductor may be arranged on the surface of the substrate part 2.

The substrate part 2 is covered with the insulating layer 3, and the thin coating heater 4 and the electrode part 5 are equipped inside the insulating layer 3. The insulating layer 3 is constituted by laminating a first insulating layer 3a, a second insulating layer 3b and a third insulating layer 3c in this order from the substrate part 2 side.

On the mounting surface 1a side of the heater component 1, the first insulating layer 3a is arranged between the substrate part 2 and the thin coating heater 4, so that the substrate part 2 and the thin coating heater 4 are insulated. In addition, the second insulating layer 3b is arranged between the thin coating heater 4 and the electrode part 5, so that the thin coating heater 4 and the electrode part 5 are insulated. The third insulating layer 3c is arranged outside the electrode pan 5, so that the outside of the electrode part 5 is insulated.

On the bottom surface 1b side of the heater component 1, a first power supplying port 6 penetrating the second insulating layer 3b and the third insulating layer 3c is formed, and a second power supplying port 7 penetrating the third insulating layer 3c is formed.

The first insulating layer 3a to the third insulating layer 3c can be formed by, for example, a thermal spraying method, but may be formed by another coating forming method such as a PVD method or a CVD method.

Constituent materials of the first insulating layer 3a to the third insulating layer 3c are not particularly limited as long as they provide insulating property. However, for the first insulating layer 3a and the second insulating layer 3b, materials satisfying required thermal conductivity and insulating property simultaneously are suitable. For the third insulating layer 3c, materials further having plasma resistance and wear resistance are suitable. Each of the first insulating layer 3a to the third insulating layer 3c is not required to be a monolayer, and may be composed of a plurality of layers.

A thickness of each of the first insulating layer 3a to the third insulating layer 3c is, for example, 50 to 2000 μm. When the thickness of each of the first insulating layer 3a to the third insulating layer 3c is changed, heat removal efficiency by the first insulating layer 3a to the third insulating layer 36c can be adjusted.

The constituent materials of the first insulating layer 3a to the third insulating layer 3c include oxide ceramics, nitride ceramics, fluoride ceramics, carbide ceramics, boride ceramics, compounds containing them, or mixtures thereof.

The oxide ceramics have wear resistance, and additionally, are stable in oxygen-based plasma used in a plasma etching process, and show relatively good plasma resistance even in chlorine-based plasma. Since the nitride ceramics have high hardness, they are hardly damaged by friction with the wafer and hardly generate wear powder. Furthermore, since thermal conductivity of the nitride ceramics is relatively high, it is easy to control a temperature of the wafer W during processing. The fluoride ceramics are stable in fluorine-based plasma and can exhibit excellent plasma resistance.

Specific examples of the oxide ceramics include $Al_2O_3$, $TiO_2$, $SiO_2$, $Cr_2O_3$, $ZrO_2$, $Y_2O_3$, $MgO$, $CaO$ and $La_2O_3$.

Examples of the nitride ceramics include TiN, TaN, AlN, BN, $Si_3N_4$, HfN, NbN, YN, ZrN, $Mg_3N_2$ and $Ca_3N_2$. Examples of the fluoride ceramics include LiF, $CaF_2$, $BaF_2$, $YF_3$, $AlF_3$, $ZrF_4$ and $MgF_2$. Examples of the carbide ceramics include TiC, WC, TaC, $B_4C$, SiC, HfC, ZrC, VC and $Cr_3C_2$. Examples of the boride ceramics include $TiB_2$, $ZrB_2$, $HfB_2$, $VB_2$, $TaB_2$, $NbB_2$, $W_2B_5$, $CrB_2$ and $LaB_6$.

The thin coating heater 4 formed between the first insulating layer 3a and the second insulating layer 3b has a specific resistance value which can be used as a heater. By applying prescribed voltage to the thin coating heater 4 to flow electric current therethrough, the wafer W mounted on the mounting surface 1a of the heater component 1 can be heated.

The thin coating heater 4 is formed in an elongated strip-shaped pattern from the viewpoint of improving temperature uniformity in the heater area. Furthermore, the heater body 10 located immediately below the wafer W has a plurality of repeated patterns arranged in parallel at a required interval from each other. Thus, a pseudo heated surface is formed by the heater body 10, so that the wafer W can be heated widely and uniformly.

A thickness of the thin coating heater 4 is preferably in the range of 10 to 1000 μm. When the thickness of the thin coating heater 4 is less than 10 μm, there is a possibility that a calorific value is too large or coating formation does not become to be stable. When the thickness of the thin coating heater 4 exceeds 1000 μm, there is a possibility that the calorific value becomes to be too small.

A line width of the thin coating heater 4 is preferably in the range of 1 to 5 mm. By setting the line width of the thin coating heater 4 to 1 mm or more, possibility of disconnection can be reduced. By setting the line width to 5 mm or less, temperature unevenness in the heater area can be reduced.

An interlinear distance of the thin coating heater 4 is preferably in the range of 0.5 to 50 mm. By setting the interlinear distance of the thin coating heater 4 to 0.5 mm or more, short circuit can be avoided. By setting the interlinear distance to 50 mm or less, temperature unevenness in the heater area can be reduced.

A constituent material of the thin coating heater 4 is not limited as long as it can be used as a heater. A preferable material is a metal element selected from Mo, W, Ta, Cr, Ti, Al, Si, Ni, Nb, Fe, Cu, Ag and Pt, an alloy containing one or more of these metal elements, a conductive compound containing one or more of these metal elements, or a mixture thereof.

The thin coating heater 4 is formed of a thermal sprayed coating. By using a thermal spraying method, a thin coating can be formed continuously and uniformly without being limited by size and shape of the substrate part 2. The thin coating heater 4 can be formed by thermally spraying the constituent material of the thin coating heater 4 on an upper surface of the first insulating layer 3a formed on the surface of the substrate part 2. The thermal spraying method may be any of atmospheric plasma spraying, low pressure plasma spraying, water stabilized plasma spraying, arc spraying, high velocity flame spraying, low velocity flame spraying and cold spraying.

A pattern of the thin coating heater 4 may be produced by previously masking the surface of the first insulating layer 3a formed on the substrate part 2 in a pattern shape and thermally spraying the entire surface, or may be produced by thermally spraying the entire surface of the first insulating layer 3a, masking a surface of a thermal sprayed coating in a pattern shape and removing unnecessary thermal sprayed coating in accordance with machine processing or blast processing.

The electrode part 5 formed between the second insulating layer 3b and the third insulating layer 3c can attract and fix the wafer W mounted on the mounting surface 1a of the heater component 1 by applying prescribed voltage to the electrode part 5.

A method for attracting the wafer W by the electrode part 5 may be a monopolar type or a bipolar type. A constituent material and a manufacturing method of the electrode part 5 are not limited. By using the thermal spraying method, coating can be performed continuously and uniformly without being limited by size and shape of the substrate part 2. For example, the electrode part 5 can be formed by thermal spraying a conductive material such as tungsten on an upper surface of the second insulating layer 3b formed so as to cover the thin coating heater 4.

It is preferred that thermal spray powder for forming the first insulating layer 3a to the third insulating layer 3c, the thin coating heater 4 and the electrode part 5 has a particle size in the range of 5 to 80 μm. When the particle size is too small, fluidity of the powder will be reduced and stable supply will not be possible, so that the thickness of coating will tend to be uneven. When the particle size is too large, coating is formed without complete melting of the powder, so that the coating becomes to be porous excessively and to be a rough coating.

The thermal sprayed coating which can form the first insulating layer 3a to the third insulating layer 3c, the thin coating heater 4 and the electrode part 5 is a porous coating, and an average porosity thereof is preferably in the range of 1 to 10%. The average porosity can be adjusted by the thermal spraying method or thermal spraying conditions. When the average porosity is smaller than 1%, influence of residual stress existing in the thermal sprayed coating increases, so that the coating may possibly be easily broken. When the average porosity exceeds 10%, various gases used in the semiconductor manufacturing process easily enter into the thermal sprayed coating, so that durability may possibly be reduced. The average porosity can be measured by observing a cross section of a thermal sprayed coating by using an optical microscope, binarizing an observed image, treating a black region inside the coating as a pore part, and calculating the area ratio of the black region with respect to the entire area.

The shape of the thin coating heater 4 will be described in detail. FIG. 3 is an enlarged perspective view showing a connecting portion between the heater body 10 and the heater extension part 11 of the thin coating heater 4. The thin coating heater 4 has the heater body 10 and the heater extension part 11 extended from the heater body 10. The heater body 10 functions as a heating means for the wafer W, whereas the heater extension part 11 functions as a power supplying means (bypass) to the heater body 10 and does not function as a heating means for the wafer W.

The heater body 10 has a pattern in which a plurality of similar shapes are repeated, and is formed concentrically as a whole. A design of the heater body 10 can be changed according to the shape and size of the object to be heated, and for example, it may be a rectangular shape having a zigzag pattern. A part of the outermost periphery of the heater body 10 serves as an outlet 10a, and the outlet 10a extends radially outward to constitute the heater extension part 11.

The heater body 10 and the heater extension part 11 may be formed integrally, or may be formed by connecting different members to each other. It is preferred that these are formed integrally from the viewpoint of not providing structural singularity. Similarly, the heater extension part 11 may be composed of the same constituent material as the heater body 10, or may be composed of a different constituent material from the heater body 10. It is preferred that these are composed of the same constituent material from the viewpoint of not providing material singularity. Furthermore, the heater extension part 11 may have the same thickness and width as the heater body 10, or may have different thickness and width from the heater body 10. It is preferred that these have the same thickness and width from the viewpoint of manufacturing.

The heater extension part 11 includes two extension parts 11a and 11b which are parallel to each other, and is extended on a side surface 2c ranging between the first end face 2a and the second end face 2b of the substrate part 2. The heater extension part 11 is further bent radially inward at a corner of the second end face 2b of the substrate part 2, and is extended to a heater power supplying part 12.

That is, the heater extension part 11 has a U-shaped cross section as a whole, and is formed so as to surround the substrate part 2 from the side. A tip part 11s entering into the second end face 2b side of the substrate part 2 constitutes the heater power supplying part 12. Accordingly, the heater power supplying part 12 is constituted on a surface of the substrate part 2, and the surface is opposite to the surface on which the heater body 10 is arranged.

The heater power supplying part 12 is formed on the first insulating layer 3a, is exposed to the outside at a position where the heater power supplying part 12 and the first power supplying port 6 cross, and can be connected to an external component which supplies electric power. That is, according to the present embodiment, electric power can be supplied to the heater body 10 without providing a conventional power supplying mechanism which penetrates a substrate part.

Since the thin coating heater 4 is formed of a thermal sprayed coating having a small thickness, it is preferred that the heater power supplying part 12 has, as a connection mode to an external power source, any of a connection structure to which a tip of a power supplying cable is joined, a connection structure to which a tip of a power supplying cable is connected via a power supplying socket, and a connection structure to which a tip of a power supplying cable is directly pressed and attached. A method for connecting the power supplying cable to the heater power supplying part 12 includes soldering, brazing, welding and the like. In case the power supplying socket is used, the power supplying socket is preferably welded to the heater power supplying part 12. In case the power supplying cable is directly pressed and attached to the heater power supplying part 12, means such as screwing for fixing the power supplying cable to the substrate part 2 is required.

The shape of the electrode part 5 will be described in detail. Like the thin coating heater 4, the electrode part 5 has an electrode body 15 and an electrode extension part 16 extended from the electrode body 15. The electrode body 15 and the electrode extension part 16 may be formed integrally, or may be formed by connecting different members to each other. It is preferred that these are formed integrally from the viewpoint of not providing structural singularity. Similarly, the electrode extension part 16 may be composed of the same constituent material as the electrode body 15, or may be composed of a different constituent material from the electrode body 15. It is preferred that these are composed of the same constituent material from the viewpoint of not providing material singularity. Furthermore, the electrode extension part 16 may have the same thickness and width as the electrode body 15, or may have different thickness and width from the electrode body 15. It is preferred that these have the same thickness and width from the viewpoint of manufacturing.

The shape of the electrode body 15 differs greatly depending on whether it is a monopolar type or a bipolar type. In case of the monopolar type, it may be a circular shape without gap(s) or a circular shape including slit(s). In case of the bipolar type, there are a type in which two semicircular electrodes are formed at a required distance, and a type in which two electrodes are formed in a comb shape at a required interval from each other. A design of the electrode body 15 can be changed according to the shape and size of the object to be attracted, and may be a rectangular shape or a rectangular shape having some slits.

In the present embodiment, regardless of whether the electrode extension part 16 is a monopolar type or a bipolar type, a part of the outermost periphery of the electrode body 15 serves as an outlet, and the outlet extends radially outward to constitute the electrode extension part 16. The electrode extension part 16 is extended on the side surface 2c ranging between the first end face 2a and the second end face 2b of the substrate part 2. The electrode extension part 16 is further bent radially inward at the corner of the second end face 2b of the substrate part 2, and is extended to an electrode power supplying part 17.

That is, the electrode extension part 16 has a U-shaped cross section as a whole, and is formed so as to surround the substrate part 2 from the side. A tip part entering into the second end face 2b side constitutes the electrode power supplying part 17. Accordingly, the electrode power supplying part 17 is constituted on a surface of the substrate part 2, and the surface is opposite to the surface on which the electrode body 15 is arranged.

In the present embodiment, the electrode power supplying part 17 is formed on the second insulating layer 3b, is exposed to the outside at a position where the electrode power supplying part 17 and the second power supplying port 7 cross, and can be connected to an external component which supplies electric power. That is, according to the present embodiment, electric power can be supplied to the electrode body 15 without providing a conventional power supplying mechanism which penetrates a substrate part.

In case the electrode part 5 is formed of a thermal sprayed coating, like the thin coating heater 4, it is preferred that the electrode power supplying part 17 has, as a connection mode to the external power source, any of a connection structure to which a tip of a power supplying cable is joined, a connection structure to which a tip of a power supplying cable is connected via a power supplying socket, and a connection structure to which a tip of a power supplying cable is directly pressed and attached.

FIG. 4 is a cross-sectional view showing one example of a plasma processing apparatus 30 in which the heater component of the present embodiment is applied to an electrostatic chuck. An electrostatic chuck 32 for holding a wafer W is equipped in a vacuum chamber 31 of the plasma processing apparatus 30. The wafer W is moved in and out of the vacuum chamber 31 by using a transfer arm or the like.

The vacuum chamber 31 is provided with a gas introduction device 33, an upper electrode 34 and the like. A support pail 37 is equipped around the upper electrode 34. The electrostatic chuck 32 includes the substrate part 2 as a lower electrode, the insulating layer 3, the thin coating heater 4 and the electrode part 5. Power sources 44 and 45 for plasma generation are electrically connected to the upper electrode 34 and the substrate part 2 as a lower electrode, respectively. A power source 46 for attracting the wafer W is electrically connected to the electrode part 5, and a power source 47 for causing the thin coating heater 4 to generate heat is electrically connected to the thin coating heater 4.

When a high-frequency voltage is applied between the substrate part 2 and the upper electrode 34, introduced processing gas is turned into plasma. Since ions of generated plasma are drawn into the wafer W, etching is performed. Also at this time, a temperature of the water W increases. A focus ring F is equipped around the wafer W so that effects of the etching do not decrease also in the vicinity of the outer edge of the wafer W. The thin coating heater 4 can keep a temperature of not only the wafer W but also the focus ring F constant. The substrate part 2 includes a cooling mechanism having a water cooling structure or a gas cooling structure, which is not illustrated, and the like, and enables temperature control of the thin coating heater 4.

FIG. 5 is a plan view showing an example of a pattern of the thin coating heater. The heater body 10 and the heater extension part 11 shown in FIG. 5 are formed on a circular substrate part, and the heater body 10 is formed in a pseudomonas circular shape according to the shape of the wafer W mounted thereon. By drawing the heater body 10 substantially concentrically as shown in the figure, a circular pseudo-surface which can uniformly heat the surface can be formed by one line.

FIGS. 6 and 7 are perspective views each showing a modified example of the electrostatic chuck. A step part 51 is formed in a peripheral part of each electrostatic chuck shown in these figures. The heater body 10 of the thin coating heater 4 is formed concentrically on a wafer mounting surface of the substrate part 2 with a narrow interline distance according to the shape of the water W. A part of the outermost periphery of the heater body 10 extends radially outward to constitute the heater extension part 11. The heater extension part 11 is further extended along the side surface of the substrate part 2 onto a surface, and the surface is opposite to the surface on which the heater body 10 is arranged. A tip part of the heater extension part 11 constitutes the heater power supplying part 12. Furthermore, the electrode body 15 of the electrode part is arranged in a circular shape on the mounting surface of the substrate part 2. A part of the outermost periphery of the electrode body 15 extends radially outward to constitute the electrode extension part 16. The electrode extension part 16 is further extended along the side surface of the substrate part 2 onto a surface, and the surface is opposite to the surface on which the electrode body 15 is arranged. A tip part of the electrode extension part 16 constitutes the electrode power supplying part 17.

FIG. 8 is a perspective view showing another example of the thin coating heater 4 in the electrostatic chuck shown in FIGS. 6 and 7. In the example shown in FIG. 8, the heater body 10 is circumferentially arranged not only on the wafer mounting surface of the substrate part 2 but also on all surfaces constituting the step part 51. Also the heater body 10 is formed in a zigzag shape so as to be bent at a plurality of positions. According to this configuration, a temperature of the focus ring F can be controlled.

When the heater component 1 of the present embodiment is applied to a plasma processing apparatus, temperature distribution of the wafer W and the focus ring F can be made uniform, and processing at high accuracy becomes to be possible. Accordingly, a semiconductor component having high quality can be produced with high yield.

The above embodiment is an exemplification of the present invention, and does not limit the present invention. The heater component according to the present invention may include other constituents as long as effects of the present invention are not impaired. Forms of the thin coating heater, the electrode part and the insulating layer can be appropriately changed according to purpose of machining process. Examples of the object to be held by the electrostatic chuck include a glass substrate of a flat panel display, and the like, in addition to a wafer.

The heater component of the present invention may be applied to other parts of the plasma processing apparatus. FIG. 9 is a cross-sectional view showing one example of a plasma processing apparatus in which the heater component according to one embodiment of the present invention is applied to each of the upper electrode 34 and a chamber wall 36. A power source 48 for causing a thin coating heater 40 to generate heat is electrically connected to the thin coating heater 40, and the thin coating heater 40 can control a temperature of the upper electrode 34 and a temperature of the support part 37 surrounding the upper electrode 34. A power source 49 for causing a thin coating heater 41 to generate heat is electrically connected to the thin coating heater 41, and the thin coating heater 41 can control a temperature of the chamber wall 36. Although not shown in the figure, insulating layers are arranged between the upper electrode 34 and the thin coating heater 40, and between the chamber wall 36 and the thin coating heater 41, respectively. The upper electrode 34 is insulated from the thin coating heater 40, and the chamber wall 36 is insulated from the thin coating heater 41.

Figure 10B:
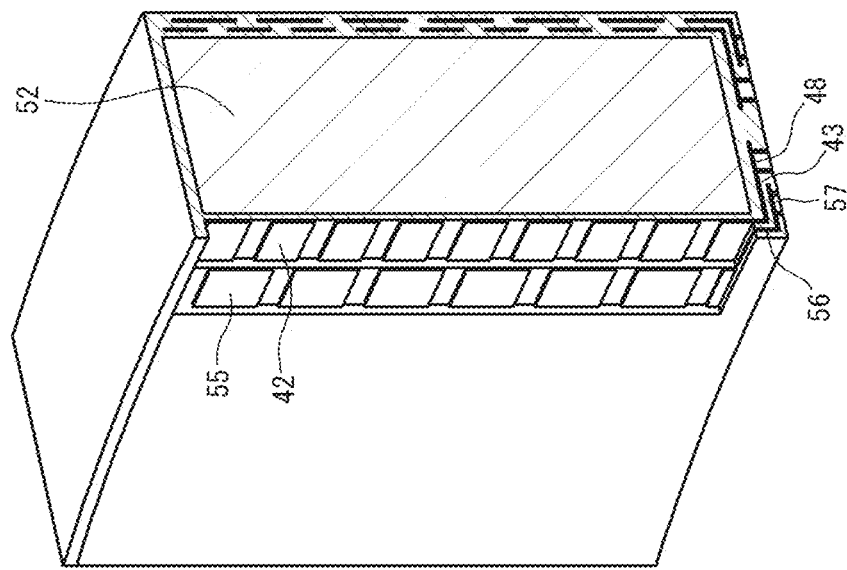

FIGS. 10A and 10B are perspective views each showing one embodiment when a substrate part has a tubular shape (annular shape). FIG. 10A shows a cross section on the inner peripheral surface side of a substrate part 52, and FIG. 10B shows a cross section on the outer peripheral surface side of the substrate part 52. In the embodiment according to FIGS. 10A and 10B, a heater body 42 of the thin coating heater and an electrode body 55 of the electrode part are formed on both of the inner peripheral surface side and the outer peripheral surface side of the substrate part 52 in a strip-shaped pattern in parallel with each other along the respective peripheral surfaces. In this embodiment, a temperature of the object to be heated, which exists on the inner peripheral surface side and the outer peripheral surface side of the substrate part 52, can be controlled by action of the heater body 42. Furthermore, an electric field can be generated on each of the inner peripheral surface side and the outer peripheral surface side of the substrate part 52 by action of the electrode body 55. In the embodiment according to FIGS. 10A and 10B, a heater extension part 43 of the thin coating heater and an electrode extension part 56 of the electrode part are extended toward the bottom surface side of the substrate part 52, and respective tip parts thereof constitute a heater power supplying part 48 and an electrode power supplying part 57. According to this configuration, temperature uniformity on the inner peripheral surface side and the outer peripheral surface side of the substrate part 52 can be improved.

FIG. 11 is a perspective view showing one embodiment when a substrate part has a tubular shape (annular shape). In the embodiment according to FIG. 11, a heater body 60 of the thin coating heater and an electrode body 61 of the electrode part are formed on the mounting surface side of a substrate part 62, and both of the heater body 60 and the electrode body 61 are formed in a strip-shaped pattern in parallel with each other. In this embodiment, a temperature of the object to be heated, which is mounted on the mounting surface of the substrate part 62, can be controlled. In the embodiment according to FIG. 11, a heater extension part 63 which is led from one end of the heater body 60 is extended along the side surface of the substrate part 62 to the bottom surface side of the substrate part 62, and a tip part of the heater extension part 63 constitutes a heater power supplying part 65. Furthermore, an electrode extension part 64 which is led from one end of the electrode body 61 is extended along the side surface of the substrate part 62 to the bottom surface side of the substrate part 62, and a tip part of the electrode extension part 64 constitutes an electrode power supplying part 66. According to this configuration, temperature uniformity on the mounting surface side of the substrate part 62 can be improved.

FIG. 12 is a perspective view showing one embodiment when a substrate part has a three-dimensional shape including a step part. In the embodiment according to FIG. 12, a heater body 70 of the thin coating heater and an electrode body 71 of the electrode part are formed on the side surface of a substrate part 72, and both of the heater body 70 and the electrode body 71 are formed in a strip-shaped pattern in parallel with each other. In this embodiment, there are a plurality of side surfaces of the substrate part 72, and a temperature of the object to be heated, which is located on the side of each side surface, can be controlled. The heater bodies 70 arranged on the respective side surfaces of the substrate part 72 are electrically connected to each other via a heater extension part 73 formed on a step part 77 which is located between these side surfaces. Furthermore, the electrode bodies 71 arranged on the respective side surfaces of the substrate part 72 are also electrically connected to each other via an electrode extension part 74 formed on the step part 77 which is located between these side surfaces. In the embodiment according to FIG. 12, a heater extension part 73 which is led from one end of the heater body 70 is extended along the bottom surface of the substrate part 72, and a tip part of the heater extension part 73 constitutes a heater power supplying part 75. Furthermore, an electrode extension part 74 which is led from one end of the electrode body 71 is extended along the bottom surface of the substrate part 72, and a tip part of the electrode extension part 74 constitutes an electrode power supplying part 76. As described above, even when the substrate part 72 has a step part, temperature uniformity of each heated surface can be improved.

As mentioned above, several embodiments of the heater component according to the present invention have been exemplified. It is also possible to take out some of technical features and combine them with each other, in these embodiments. An apparatus to which the heater component according to the present invention is applied may be a CVD apparatus or a sputtering apparatus. Furthermore, an apparatus to which the heater component according to the present invention is applied is not limited to a semiconductor-related apparatus. The heater component according to the present invention may be applied to any product in which temperature uniformity in the heater area is required.

DESCRIPTION OF REFERENCE CHARACTERS

1 Heater component
1*a* Mounting surface
1*b* Bottom surface
2, 52, 62, 72 Substrate part
2*a* First end face
2*b* Second end face
2*c* Side surface
3 Insulating layer
3*a* First insulating layer
3*b* Second insulating layer
3*c* Third insulating layer
4, 40, 41 Thin coating heater
5 Electrode part
6 First power supplying port
7 Second power supplying port
10, 42, 60, 70 Heater body
11, 43, 63, 73 Heater extension part
11*s* Tip part
12, 48, 65, 75 Heater power supplying part
15, 55, 61, 71 Electrode body
16, 56, 64, 74 Electrode extension part
17, 57, 66, 76 Electrode power supplying part
30 Plasma processing apparatus
31 Vacuum chamber
32 Electrostatic chuck
33 Gas introduction device
34 Upper electrode
36 Chamber wall
37 Support part
44, 45, 46, 47, 48, 49 Power source
51, 77 Step part
W Wafer
F Focus ring

The invention claimed is:

1. A heater component comprising:
a substrate part; and
a thin coating heater which is equipped outside the substrate part and generates heat by power supply, wherein
the thin coating heater is formed of a thermal sprayed coating, and has a heater body and a heater extension part extended from the heater body,
the heater extension part is extended onto a surface of the substrate part, and the surface is different from a surface of the substrate part on which the heater body is arranged, and
a tip part of the heater extension part constitutes a heater power supplying part for supplying electric power to the heater body,
the heater component further comprising an electrode part outside the substrate part, wherein
the electrode part is formed of a thermal sprayed coating, and has an electrode body and an electrode extension part extended from the electrode body,
the electrode extension part is extended onto a surface of the substrate part, and the surface is different from a surface of the substrate part on which the electrode body is arranged, and a tip part of the electrode extension part constitutes an electrode power supplying part for supplying electric power to the electrode body.

2. The heater component according to claim 1, wherein the substrate part has a three-dimensional shape having a first end face and a second end face facing the first end face,
the heater body is arranged on the first end face,
the heater extension part is extended on a side surface ranging between the first end face and the second end face, and
the heater power supplying part is constituted on the side surface.

3. The heater component according to claim 1, wherein the substrate part has a three-dimensional shape having a first end face and a second end face facing the first end face, the heater body is arranged on the first end face, the heater extension part is extended on a side surface ranging between the first end face and the second end face, and the heater power supplying part is constituted on the second end face.

4. The heater component according to claim 1, wherein the thin coating heater is formed in a strip shape, and the heater body has a repeated pattern.

5. The heater component according to claim 1, wherein the thin coating heater comprises a metal element selected from Mo, W, Ta, Cr, Ti, Al, Si, Ni, Nb, Fe, Cu, Ag and Pt, an alloy containing one or more of these metal elements, a conductive compound containing one or more of these metal elements, or a mixture thereof.

6. The heater component according to claim 1, wherein the heater power supplying part has any of a connection structure to which a tip of a power supplying cable is joined, a connection structure to which a tip of a power supplying cable is connected via a power supplying socket, and a connection structure to which a tip of a power supplying cable is directly pressed and attached.

7. The heater component according to claim 1, wherein the substrate part has a three-dimensional shape having a first end face and a second end face facing the first end face, the electrode body is arranged on the first end face, the electrode extension part is extended on a side surface ranging between the first end face and the second end face, and the electrode power supplying part is constituted on the side surface.

8. The heater component according to claim 1, wherein the substrate part has a three-dimensional shape having a first end face and a second end face facing the first end face, the electrode body is arranged on the first end face, the electrode extension part is extended on a side surface ranging between the first end face and the second end face, and the electrode power supplying part is constituted on the second end face.

* * * * *